United States Patent [19]
Shibatani

[11] Patent Number: 6,147,739
[45] Date of Patent: Nov. 14, 2000

[54] DRIVE IC, LIQUID CRYSTAL PANEL, LIQUID CRYSTAL DEVICE, AND ELECTRONIC APPARATUS

[75] Inventor: Takayuki Shibatani, Suwa, Japan

[73] Assignee: Seiko Epson Corporation, Tokyo, Japan

[21] Appl. No.: 08/824,208

[22] Filed: Mar. 25, 1997

[30] Foreign Application Priority Data

Mar. 27, 1996 [JP] Japan .................................... 8-071872
Feb. 27, 1997 [JP] Japan .................................... 9-044382

[51] Int. Cl.[7] .................................................. G02F 1/1395
[52] U.S. Cl. .......................... 349/152; 399/149; 399/151
[58] Field of Search ...................... 349/151, 152, 349/149

[56] References Cited

U.S. PATENT DOCUMENTS

| | | | |
|---|---|---|---|
| 4,586,789 | 5/1986 | Kishimoto et al. | 349/152 |
| 4,682,858 | 7/1987 | Kanbe et al. | 349/151 |
| 4,985,663 | 1/1991 | Nakatani | 349/152 |
| 5,712,493 | 1/1998 | Mori et al. | 349/151 |
| 5,798,812 | 8/1998 | Nishiki et al. | 349/152 |

*Primary Examiner*—William L. Sikes
*Assistant Examiner*—Toan Ton
*Attorney, Agent, or Firm*—Oliff & Berridge, PLC

[57] ABSTRACT

A liquid crystal device is formed by mounting a drive IC on a liquid crystal panel. The liquid crystal panel comprises a plurality of signal electrodes formed on a first transparent substrate, a plurality of scan electrodes formed on a second transparent substrate, and an IC installation area formed on the second transparent substrate. The signal electrodes and the scan electrodes extend up to the IC installation area. The drive IC comprises scan electrode bumps that conductively connect to the scan electrodes, and signal electrode bumps that conductively connect to the signal electrodes. Also, a wide gap is formed between scan electrode bumps adjacent signal electrode bumps.

26 Claims, 6 Drawing Sheets

DRIVE IC, LIQUID CRYSTAL PANEL, LIQUID CRYSTAL DEVICE, AND ELECTRONIC APPARATUS

BACKGROUND OF THE INVENTION

1. Field of Invention

The present invention relates to a drive IC for driving a liquid crystal, a liquid crystal panel, a liquid crystal device formed by installing a liquid crystal drive IC on a liquid crystal panel, and an electronic apparatus having the liquid crystal device.

2. Description of Related Art

In recent years, liquid crystal devices have come to be used widely as the visual information displays for various types of electronic apparatuses such as portable telephones, digital still cameras, video cameras, and others. When a liquid crystal device is used in a portable telephone, the liquid crystal device is used for displaying such information as a telephone number, and the like. Also, when a liquid crystal device is used in a digital still camera or a video camera, the liquid crystal device is commonly used as a finder for confirming the object.

A liquid crystal device generally is formed by implementing a drive IC on the liquid crystal panel. In particular, in a portable information terminal represented by a portable telephone, it is common to be driven by a single low-cost and low-consumption drive IC, being a so-called single-chip IC. Furthermore, most recently, liquid crystal devices constructed by mounting a drive IC directly on the liquid crystal panel itself, being so-called COG (chip on glass) type liquid crystal devices, are becoming more widespread.

With these COG type liquid crystal devices, the drive IC is affixed directly on a transparent substrate of the liquid crystal panel. Also, the electrode terminals provided on the drive IC, namely the bumps or pads, and the electrodes formed on the transparent substrate are connected electrically, being so-called conductively connected. The drive IC 51 as shown in FIG. 8 generally has signal electrode terminals Bsi that conductively connect the signal electrodes Psi on the liquid crystal panel side, and scan electrode terminals Bso that conductively connect the scan electrodes Pso on the liquid crystal panel side. Also, with the conventional drive IC 51, both the signal electrode terminals Bsi and the scan electrode terminals Bso were adjacent at the identical pitch of the pitch among the signal electrode terminals Bsi and the pitch among the scan electrode terminals Bso. That pitch is generally 80–100 $\mu$m.

In an ordinary liquid crystal device manufacturing process, in order to test whether or not the liquid crystal panel has the expected display properties, it is common that the liquid crystal panel be tested as a unit by printing a fixed voltage to the signal electrodes Psi and the scan electrodes Pso of the liquid crystal panel before installing the drive IC on the liquid crystal panel. Also, when printing the fixed voltage in this manner, a signal electrode conductive member 53si is contacted to the signal electrodes Psi, a scan electrode conductive member 53so is contacted to the scan electrodes Pso, and the fixed voltage is printed to each electrode Psi and Pso by a display test circuit 52 via the conductive members 53si and 53so.

Nevertheless, when performing testing related to a liquid crystal panel having the above-mentioned conventional drive IC 51, because in the conventional drive IC 51 the signal electrode terminals Psi and the scan electrode terminals Bso were adjacent at the identical narrow pitch among their respective electrode terminals, when trying to contact the conductive members 53si and 53so variously to each electrode Psi and Pso corresponding to all the electrode terminals present at the interface of those electrode terminals, there was the risk of the test becoming impossible due to shorting by those conductive members 53si and 53so contacting each other. Also, if the gap between the signal electrode conductive member 53si and the scan electrode conductive member 53so is made wider in order to avoid shorting, there was a problem that the fixed voltage could no longer be printed in the electrode sections not having those conductive members present. Therefore, a part of the display area of the liquid crystal panel could not be displayed.

Regarding liquid crystal panels using a conventional drive IC in this manner, when there were defects in parts of the liquid crystal panels corresponding to the electrode sections in which the conductive members 53si and 53so could not contact, there was a problem that the defects could not be discovered. As a result, yields decreased due to defects remaining regarding the finally obtained liquid crystal panels, and cost increases were caused thereby.

SUMMARY OF THE INVENTION

The present invention was created in consideration of the above-mentioned problems, and its object is to make it possible to display and test the entire display area of a liquid crystal panel. Also, the present invention aims to provide a low-cost liquid crystal device by eliminating assuredly the defective liquid crystal panels during implementation of the drive IC.

The drive IC pertaining to the present invention is a drive IC for driving a liquid crystal panel having a plurality of scan electrodes and a plurality of signal electrodes, comprising a plurality of scan electrode terminals for making electrical connections variously with said plurality of scan electrodes, and a plurality of signal electrode terminals for making electrical connections variously with said plurality of signal electrodes. Also, with this drive IC, a gap wider than the gap among the scan electrode terminals and the gap among the signal electrode terminals is formed between mutually adjacent scan electrode terminals and signal electrode terminals.

If a wide gap is provided between the signal electrode terminals and the scan electrode terminals, a wide gap can be formed between the signal electrodes and the scan electrodes on the liquid crystal panel side electrically connected to those terminals. As a result, when conductive members are contacted to the signal electrodes and scan electrodes for testing of the liquid crystal panel, an electrical insulating space can be maintained between the signal electrode conductive member and the scan electrode conductive member even when the conductive members are contacted to all the electrodes including the electrodes present in their interface. In other words, the signal electrode conductive member can be continuous for all the signal electrodes, and furthermore, the scan electrode conductive member can be continuous for all the scan electrodes. Therefore, the quality of the display properties of the liquid crystal panel can be tested by displaying a test video image on the entirety of the display area of the liquid crystal panel.

Various methods can be considered for the method of arranging the electrode terminals in the drive IC. For example, as shown in FIG. 2 and FIG. 4, scan electrode terminals Bso and signal electrode terminals Bsi can be arranged in an array following the same one side of drive IC 11 and 21, and between those electrode terminals Bso and Psi can be formed a gap A wider than the gap among the scan electrode terminals and the gap among the signal electrode terminals.

Also, in addition to that method of arrangement, as shown in FIG. 5, scan electrode terminals Bso and signal electrode terminals Bsi can be provided respectively following separate sides adjacent to drive IC 31, and between those electrode terminals Bso and Bsi can be formed a gap A wider than the gap among the scan electrode terminals and the gap among the signal electrode terminals.

The gap between the scan electrode terminals and the signal electrode terminals is not limited to any specific value, but it can be set to 0.3 mm or more, preferably to 0.3 mm. The reason 0.3 mm is desirable is as follows. In FIG. 2, the allowable measurement error in manufacturing the signal electrodes Psi and the scan electrodes Pso formed on the transparent substrate of the liquid crystal panel, namely the measurement margin from the base external measurement of the liquid crystal panel (henceforth, "measurement margin"), is a minimum value whereby an extent of ±0.1 mm is a manufacturing possibility. Thus, in order to make it such that the signal electrodes Psi and the scan electrodes Pso do not deviate to the outside of the conductive members 13si and 13so even when the electrodes Psi and Pso are at the maximum value within the margin for the conductive members 13si and 13so, it is necessary to set the distance that the conductive elements 13si and 13so project from the signal electrode area Qsi and the scan electrode area Qso, being the areas in which the electrodes Psi and Pso are disposed, that is, the distance a the conductive elements project from the electrode terminals Bsi and Bso, to a=0.1 mm. Also, in order to prevent mutually adjacent conductive members 13si and 13so from contacting each other, it is necessary to open up a gap b between them to at least the extent of 0.1 mm. From the above, it is necessary only to make the gap A between the signal electrode terminals Bsi and the scan electrode terminals Bso at least A =a+b+a= 0.1+0.1+0.1=0.3 mm Also, the gap A between the scan electrode terminals and the signal electrode terminals is not limited to any specific value, but it can be set to 0.6 mm or more. For example, if it is made 0.6 mm, because the allowable projection measurement a of the conductive members 13si and 13so in relation to the electrode terminals Bsi and Bso can be set to a=0.2 mm, and the gap b between adjacent conductive members 13si and 13so can be set to b=0.2 mm, the measurement margin of the signal electrodes and scan electrodes formed on the liquid crystal panel can be widened to ±0.2 mm, and thus, manufacturing of the liquid crystal panel becomes easier. Of course, when testing the display properties of the liquid crystal panel as a unit, shorting of the signal electrode conductive member and the scan electrode conductive member can be prevented assuredly, moreover, the signal electrode conductive member can be continuous for all the signal electrodes, and the scan electrode conductive member can be continuous for all the scan electrodes.

Furthermore, the gap A between the scan electrode terminals and the signal electrode terminals is not limited to any specific value, but it can be set to 1.0 mm or more. For example, if it is made 1.0 mm, because the allowable projection measurement a of the conductive members 13si and 13so in relation to the electrode terminals Bsi and Bso can be set to a=0.35 mm, and the gap b between adjacent conductive members 13si and 13so can be set to b=0.3 mm, the measurement margin of the signal electrodes and scan electrodes formed on the liquid crystal panel can be widened to ±0.35 mm, and thus, manufacturing of the liquid crystal panel becomes one level easier. Of course, shorting of the signal electrode conductive member and the scan electrode conductive member can be prevented substantially completely. Moreover, the signal electrode conductive member can be substantially continuous for all the signal electrodes, and the scan electrode conductive member can be substantially continuous for all the scan electrodes.

Next, the liquid crystal panel pertaining to the present invention is a liquid crystal panel having a pair of mutually opposite translucent substrates holding liquid crystal between, comprising a plurality of scan electrodes formed on one side of the translucent substrates, a plurality of signal electrodes formed on the other side of the translucent substrates, and an IC installation area for installing a drive IC formed on either side of the translucent substrates. Also, said plurality of scan electrodes and said plurality of signal electrodes extend up to said IC installation area, and furthermore, between mutually adjacent scan electrodes and signal electrodes in the IC installation area is formed a gap wider than the gap between the scan electrodes and the gap between the signal electrodes. Here, "translucent" includes the meanings of both transparent when colorless and transparent when having color.

If a wide gap is formed between the signal electrodes and the scan electrodes in this manner, even when the signal electrode conductive member is contacted for all the signal electrodes, and the scan electrode conductive member is contacted for all the scan electrodes at the same time, an electrical insulating space always can be maintained between the signal electrode conductive member and the scan electrode conductive member. That is, the signal electrode conductive member can be continuous for all the signal electrodes, and furthermore, the scan electrode conductive member can be continuous for all the scan electrodes, without causing shorting between the signal electrode conductive member and the scan electrode conductive member. Therefore, the quality of the display properties of the liquid crystal panel can be tested regarding the entirety of the display area of the liquid crystal panel as a unit.

Various methods can be considered for the method of arranging the signal electrodes and the scan electrodes. For example, as shown in FIG. 2 and FIG. 4, the scan electrodes Pso and the signal electrodes Psi can be arranged in an array following the same one side of drive IC 11 and 21, and between those electrodes Pso and Psi can be formed a gap A wider than the gap among the scan electrodes and the gap among the signal electrodes.

Also, in addition to that method of arrangement, as shown in FIG. 5, the scan electrodes Pso and the signal electrodes Psi can be provided respectively following separate sides adjacent to the drive IC, and between those electrodes Pso and Psi can be formed a gap A wider than the gap among the scan electrodes and the gap among the signal electrodes.

In the above-mentioned liquid crystal panel, the gap between the scan electrode area Qso and the signal electrode area Qsi is equal to the gap between the scan electrode terminals Bso and the signal electrode terminals Bsi, and can be set to 0.3 mm or more, a value of 0.6 mm or more, or a value of 1.0 or more. The reasons for the various values are identical to the reasons for the same values in the case of the drive IC described above.

Next, the liquid crystal device pertaining to the present invention is a liquid crystal device having a liquid crystal panel comprising a pair of mutually opposite translucent substrates holding liquid crystal between, and a drive IC mounted on at least one of the translucent substrates. Also, the liquid crystal panel comprises a plurality of scan electrodes formed on one side of the translucent substrates, a plurality of signal electrodes formed on the other side of the translucent substrates, and an IC installation area for installing a drive IC formed on either side of the translucent substrates. Also, the plurality of scan electrodes and the plurality of signal electrodes extend up to said IC installation area.

Meanwhile, said drive IC comprises a plurality of scan electrode terminals for making electrical connections with said plurality of scan electrodes, and a plurality of signal electrode terminals for making electrical connections with said plurality of signal electrodes. Also, between mutually adjacent scan electrode terminals and signal electrode terminals is formed a gap wider than the gap among the scan electrode terminals and the gap among the signal electrode terminals. Moreover, the scan electrodes of the liquid crystal panel are conductively connected to the scan electrode terminals of the drive IC, and the signal electrodes of the liquid crystal are conductively connected to the signal electrode terminals of the drive IC.

Also, the electronic apparatus pertaining to the present invention is an electronic apparatus comprising a liquid crystal device as defined above, a power supply that supplies electric power to the liquid crystal device, and a controller that controls the operation of the liquid crystal device. Specifically, the liquid crystal device can be used as the visual information displays of portable telephones, digital still cameras, video cameras, and various other electronic apparatuses.

According to a preferred embodiment of the drive IC because a wide gap is provided between the signal electrode terminals and the scan electrode terminals, a wide gap can be formed also between the signal electrodes and the scan electrodes on the side of the liquid crystal panel conductively connected to them. As a result, even when the signal electrode conductive member is contacted to all the signal electrodes, and the scan electrode conductive member is contacted to all the scan electrodes, an electrical insulating space always can be maintained between both conductive members. In other words, the signal electrode conductive member can be continuous for all the signal electrodes, and furthermore, the scan electrode conductive member can be continuous for all the scan electrodes. Therefore, the quality of the display properties can be tested by displaying a test image to the entirety of the display area of the liquid crystal panel.

According to a preferred embodiment of the drive ICs, the arrangement pattern of the electrode terminals of the drive IC can be selected freely in combination with the arrangement patterns of the signal electrodes and the scan electrodes on the side of the liquid crystal panel.

For a preferred embodiment of the drive IC, the measurement margin when forming the signal electrodes and the scan electrodes on the transparent substrates of the liquid crystal panel correspond to the smallest margin realizable in state-of-the-art manufacturing, that is, about ±0.1 mm. If thus, testing by displaying to the entirety of the display area of the liquid crystal panel has been made possible while preventing shorts between conductive members, and furthermore, the drive IC and the liquid crystal panel can be formed at the smallest scale possible.

According to a preferred embodiment of the drive IC, because the margin in liquid crystal panel manufacturing can be taken larger than the smallest margin realizable in state-of-the-art manufacturing, the margin of the liquid crystal panel manufacturing process and the margin of placement error when testing the display properties of the liquid crystal panel unit can be widened.

According to a preferred embodiment of the drive IC, because the margin in liquid crystal panel manufacturing can be taken still larger than the previous embodiment, the margin of the liquid crystal panel manufacturing process and the margin of placement error when testing the display properties of the liquid crystal panel unit can be further widened.

According to a preferred embodiment of the liquid crystal panel, because a wide gap is formed between the signal electrodes and the scan electrodes, even when the signal electrode conductive member is contacted to all the signal electrodes, and when the scan electrode conductive member is contacted to all the scan electrodes, an electrical insulating space can always be maintained between both conductive members. In other words, the signal electrode conductive member can be continuous for all the signal electrodes, and the scan electrode conductive member can be continuous for all the scan electrodes, without causing shorting of the signal electrode conductive member and the scan electrode conductive member. Therefore, the quality of the display properties can be tested in a state having displayed a test image to the entirety of the display area of the liquid crystal panel.

According to a preferred embodiment of the liquid crystal panels, the arrangement patterns of the signal electrodes and the scan electrodes on the side of the liquid crystal panel can be selected freely according to need.

For a preferred embodiment of the liquid crystal panel, the measurement margin when forming the signal electrodes and the scan electrodes on the transparent substrates correspond to the smallest margin realizable in state-of-the-art manufacturing, that is, about ±0.1 mm. If thus, testing by displaying to the entirety of the display area of the liquid crystal panel has been made possible while preventing shorts between conductive members, and furthermore, the drive IC and the liquid crystal panel can be formed at the smallest scale possible.

According to a preferred embodiment of the liquid crystal panel, because the margin in liquid crystal panel manufacturing can be taken larger than the smallest margin realizable in state-of-the-art manufacturing, the margin of the liquid crystal panel manufacturing process and the margin of placement error when testing the display properties of the liquid crystal panel unit can be widened.

According to a preferred embodiment of the liquid crystal panel, because the margin in liquid crystal panel manufacturing can be taken still larger than the previous embodiment, the margin of the liquid crystal panel manufacturing process and the margin of placement error when testing the display properties of the liquid crystal panel unit can be further widened.

According to a preferred embodiment of the liquid crystal device and the electronic apparatus, because testing can be performed by displaying a test image to the entirety of the display area regarding the liquid crystal panel included therein, the possibility of accidentally incorporating a poor quality liquid crystal panel into a liquid crystal device or an electronic apparatus is decreased.

DETAILED DESCRIPTION OF PREFERRED EMBODIMENTS

First Embodiment

Figure 1:
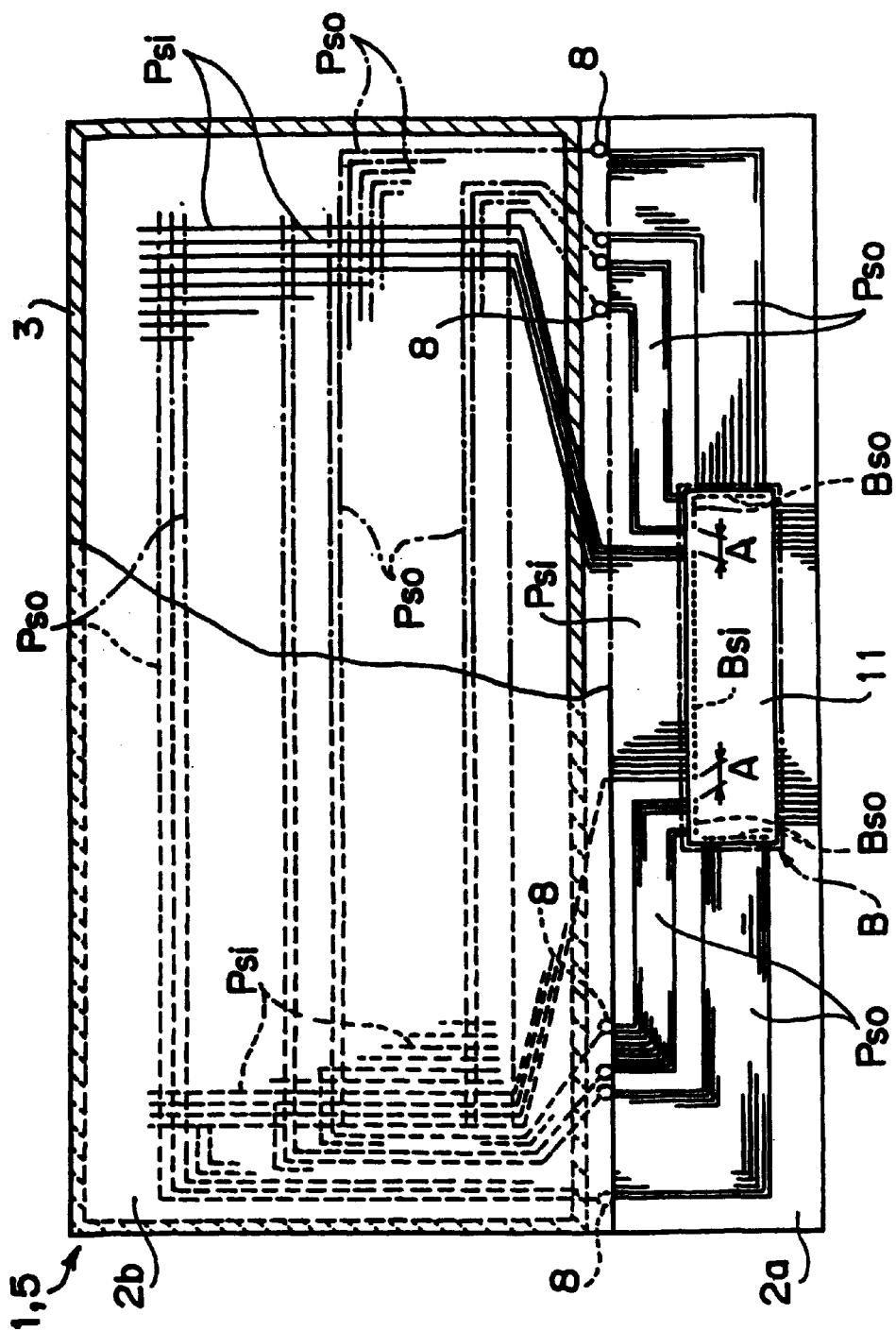
FIG. 1 is a plan view showing one embodiment of a drive IC, liquid crystal panel, and electronic apparatus pertaining to the present invention.
Figure 3:
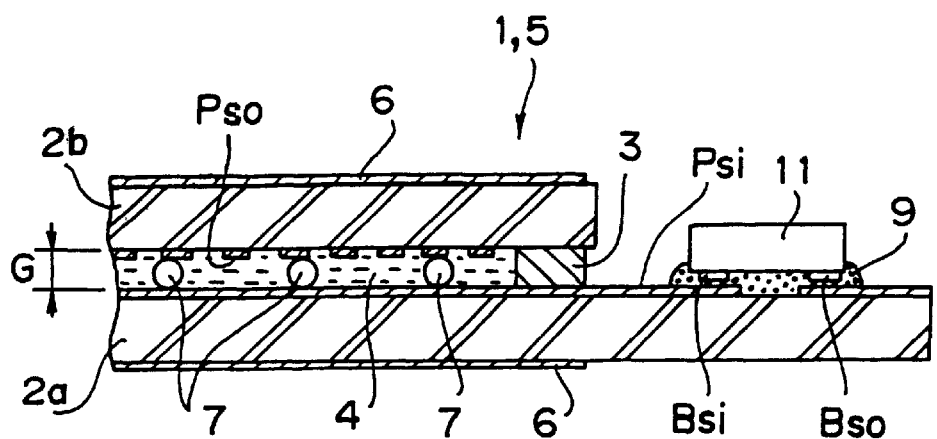
FIG. 3 is a cross-sectional view showing the cross-sectional structure of the liquid crystal device of FIG. 1.

FIG. 1 shows one embodiment of a drive IC, liquid crystal panel, and liquid crystal device pertaining to the present invention. The liquid crystal device 1 shown consists of a drive IC 11 mounted on a liquid crystal panel 5. Liquid crystal panel 5 has a pair of mutually opposite transparent substrates 2a and 2b adhered to each other by a sealing material 3 in a state maintaining a narrow gap G via spacers 7 as shown in FIG. 3. This gap G generally is called a cell gap, and liquid crystal 4 is enclosed within that cell gap G. On the outer surfaces of transparent substrates 2a and 2b are glued polarizing plates 6 and 6 according to need, and furthermore, a backlight or a reflection plate is provided for either transparent substrate.

On the inner surface of one transparent substrate 2a is formed a plurality of signal electrodes Psi, and on the inner surface of the other transparent substrate 2b is formed a plurality of scan electrodes Pso. These electrodes are formed in a stripe pattern of, for example, ITO (indium tin oxide), and they intersect each other at right angles in the adhered condition of the two transparent substrates 2a and 2b. The intersections of these scan electrodes Pso and signal electrodes Psi are used as the pixels for the liquid crystal display.

One transparent substrate 2a projects to the outside of the complementary transparent substrate 2b, a rectangular IC installation area B is provided in that projected section, and a drive IC 11 is installed in IC installation area B. The signal electrodes Psi extend up to the IC installation area B as they are, while the scanning electrodes Pso extend up to the IC installation area B by way of a continuing material 8 laid across the gap between the two transparent substrates 2a and 2b. The drive IC 11, as shown in FIG. 3, is affixed to the transparent substrate 2a via an ACF (anisotropic conductive film) or other bonding agent 9.

Figure 2:
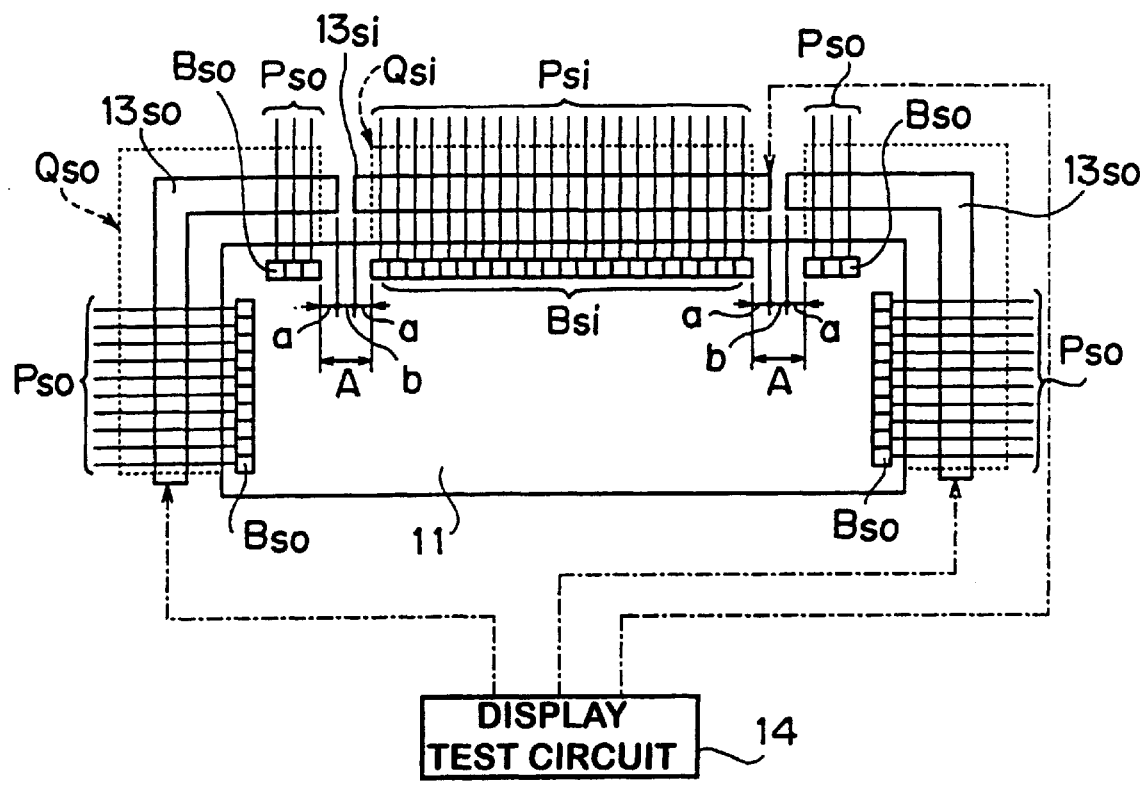
FIG. 2 is a plan view modeling the essential components of FIG. 1.

On the face of the drive IC 11 opposite the transparent substrate 2a, as shown in FIG. 2, are formed a plurality of signal electrode terminals, that is, signal electrode bumps Bsi, and a plurality of scan electrode terminals, that is, scan electrode bumps Bso. The signal electrode bumps Psi conductively connect the internal circuitry of the drive IC 11 with the signal electrodes Psi, and the scan electrode bumps Bso conductively connect the internal circuitry of the drive IC 11 with the scan electrodes Pso.

In the present embodiment, the signal electrode bumps Bsi and the scan electrode bumps Bso are arranged respectively at a narrow uniform pitch, for example, at a pitch of 80–120 $\mu$m, therefore, the gap between each bump is narrower in relation to the bumps. As opposed to this, the gap A between the signal electrode bumps Psi and the scan electrode bumps Bso is wider than the gap between same-type electrodes, for example, it is set to about 0.3 mm. The gap between the signal electrode area Qsi (the area in which the signal electrodes Psi are disposed) and the scan electrode area Qso (the area in which the scan electrodes Pso are disposed) is equal to the gap A between the scan electrode terminals Bsi and the scan electrode terminals Pso.

Because the drive IC, liquid crystal panel, and liquid crystal device of the present embodiment are configured in the above manner, when testing the display properties of the liquid crystal panel 5 as a liquid crystal panel unit prior to installing the drive IC 11 on the liquid crystal panel 5, as shown in FIG. 2, a signal electrode conductive member 13si and a scan electrode conductive member 13so are provided in advance in the specified locations. The signal electrodes Psi are then contacted to the signal electrode conductive member 13si, and the scan electrodes Pso are contacted to the scan electrode conductive member 13so. For each conductive member 13si and 13so, various types of members such as conductive rubber, a rubber connector, ACF, and the like, can be considered, but in the present embodiment, conductive rubber, being of simple structure and inexpensive, is used.

Conductive rubber is a rubber member provided with a uniform conductivity throughout, and if this is placed on a plurality of electrodes, those electrodes enter a shorted state. Also, a rubber connector is a connector formed by arranging a conductive material at a suitable interval inside a flexible insulating member. The terminals connected via the conductive material enter a continuous state, but the terminals not connected via the conductive material remain in the non-continuous state. Also, an anisotropic conductive film is a film member formed by mixing conductive particles into an insulating resinous material, and it is a material whereby the terminals having the conductive particles between are made continuous, and the terminals not having the conductive particles between remain in the non-continuous state.

When each electrode Psi and Pso contacts each conductive member 13si and 13so in the above manner, a fixed voltage is printed from the display testing circuit 14 to each conductive member 13si and 13so, and by this is performed the specified display, for example an all-white or all-black display. By observing this display with a camera or by sight, it is determined as to whether or not there are deficiencies within the display area of the liquid crystal panel 5.

Because the present embodiment as mentioned above is made so as to have a wide gap A between the signal electrode bumps Bsi and the scan electrode bumps Bso regarding the drive IC 11, and a similarly wide gap A between the signal electrode area Qsi and the scan electrode area Qso regarding the liquid crystal panel corresponding to that drive IC, the entirety of the signal electrodes Psi can be covered by compensating for the positional shift of the signal electrode conductive member 13si and the signal electrode area Qsi. Also, by making the scan electrode conductive member 13so slightly longer than the scan electrode area Qso, the entirety of the scan electrodes Pso can be covered by compensating for the positional shift of the scan electrode conductive member 13so and the scan electrode area Qso. Also, even when all the electrodes Psi and Pso are covered by both conductive members 13si and 13so, a space is opened between the two conductive members 13si and 13so, and the two can remain in an electrically insulated state. As a result, the specified test voltage can be printed to all the signal electrodes Psi and the scan electrodes Pso, and therefore, the quality of the display properties can be tested regarding the entire display area of the liquid crystal panel.

If the gap A between the signal electrode bumps Bsi and the scan electrode bumps Bso, and the gap between the signal electrode area Qsi and the scan electrode area Qso are set to about 0.3 mm, the signal electrode conductive member 13si can be lengthened laterally to about 0.1 mm more than the signal electrode area Qsi, and the scan electrode conductive member 13so can be lengthened laterally to about 0.1 mm more than the scan electrode area Qso. Consequently, the gap between the signal electrode conductive member 13si and the scan electrode conductive member 13so can be set to about 0.1 mm. If the measurement relationships of each member are set as mentioned above, the placement error margin of the signal electrode area Qsi or the scan electrode area Qso in relation to the base external surface of the liquid crystal panel becomes ±0.1 mm. This margin can be considered as the smallest margin realizable in state-of-the-art liquid crystal panel manufacturing technology.

In the present embodiment, because the drive IC is implemented in the liquid crystal panel after having tested in the above manner the display properties regarding the liquid crystal panel unit, the implementation of a drive IC in a bad liquid crystal panel is eliminated, and therefore, a low-cost liquid crystal panel can be created.

Second Embodiment

Figure 4:
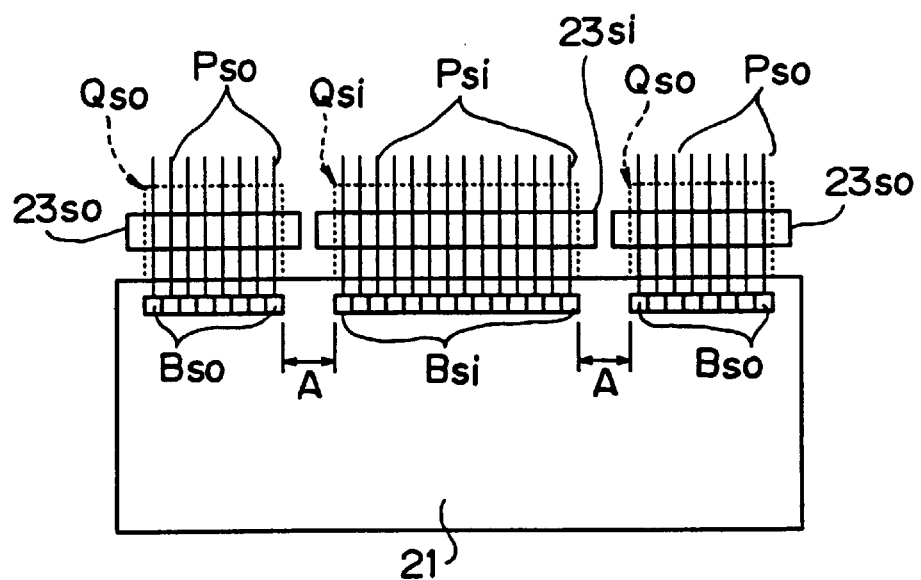
FIG. 4 is a plan view modeling the essential components of another embodiment of a drive IC pertaining to the present invention and another embodiment of a liquid crystal panel pertaining to the present invention.

FIG. 4 shows the essential components of another embodiment a drive IC and liquid crystal panel pertaining to the present invention. The point by which the drive IC 21 of this embodiment and the previous drive IC 11 shown in FIG. 2 differ is that the signal electrode bumps Bsi and the scan electrode bumps Bso are all concentrated on one same side of the drive IC 21 and bumps are not provided on the other sides.

In this embodiment as well, by providing a wide gap A between the signal electrode bumps Bsi and the scan electrode bumps Eso regarding the drive IC, moreover by providing a similarly wide gap A between the signal electrode area Qsi and the scan electrode area Qso regarding the liquid crystal panel, the entirety of the signal electrodes Psi can be covered by the signal electrode conductive member 23si, and the entirety of the scan electrodes Pso can be covered by the scan electrode conductive member 23so. Moreover, an electrical insulating space can be maintained between the two conductive members 23si and 23so. Therefore, testing can be performed by displaying a test image to the entirety of the display area of the liquid crystal panel.

Third Embodiment

In FIG. 2, the gap A between the signal electrode bumps Bsi and the scan electrode bumps Bso regarding the drive IC and the gap A between the signal electrode area Qsi and the scan electrode area Qso regarding the liquid crystal panel can be set to about 0.6 mm or more. According to these measurement settings, the signal electrode conductive member 13si can be lengthened laterally to about 0.2 mm more than the signal electrode area Qsi, and the scan electrode conductive member 13so can be lengthened laterally to about 0.2 mm more than the scan electrode area Qso. Consequently, the gap between the signal electrode conductive member 13si and the scan electrode conductive member 13so can be set to about 0.2 mm. If the measurement relationships of each member are set as mentioned above, the placement error margin of the signal electrode area Qsi or the scan electrode area Qso in relation to the base external surface of the liquid crystal panel becomes ±0.2 mm. Because this margin is greater than the ±0.1 mm in the previous embodiment, the margin of the liquid crystal panel manufacturing process and the margin of placement error when testing the display properties of the liquid crystal panel unit can be widened.

Fourth Embodiment

In FIG. 2, the gap A between the signal electrode bumps Bsi and the scan electrode bumps Bso regarding the drive IC and the gap A between the signal electrode area Qsi and the scan electrode area Qso regarding the liquid crystal panel can be set to about 1.0 mm or more. According to these measurement settings, the signal electrode conductive member 13si can be lengthened laterally to about 0.35 mm more than the signal electrode area Qsi, and the scan electrode conductive member 13so can be lengthened laterally to about 0.35 mm more than the scan electrode area Qso. Consequently, the gap between the signal electrode conductive member 13si and the scan electrode conductive member 13so can be set to about 0.3 mm. If the measurement relationships of each member are set as mentioned above, the placement error margin of the signal electrode area Qsi or the scan electrode area Qso in relation to the base external surface of the liquid crystal panel becomes ±0.3 mm. Because this margin is greater than the ±0.2 mm in the previous embodiment, the margin of the liquid crystal panel manufacturing process and the margin of placement error when testing the display properties of the liquid crystal panel unit can be further widened.

Fifth Embodiment

Figure 5:
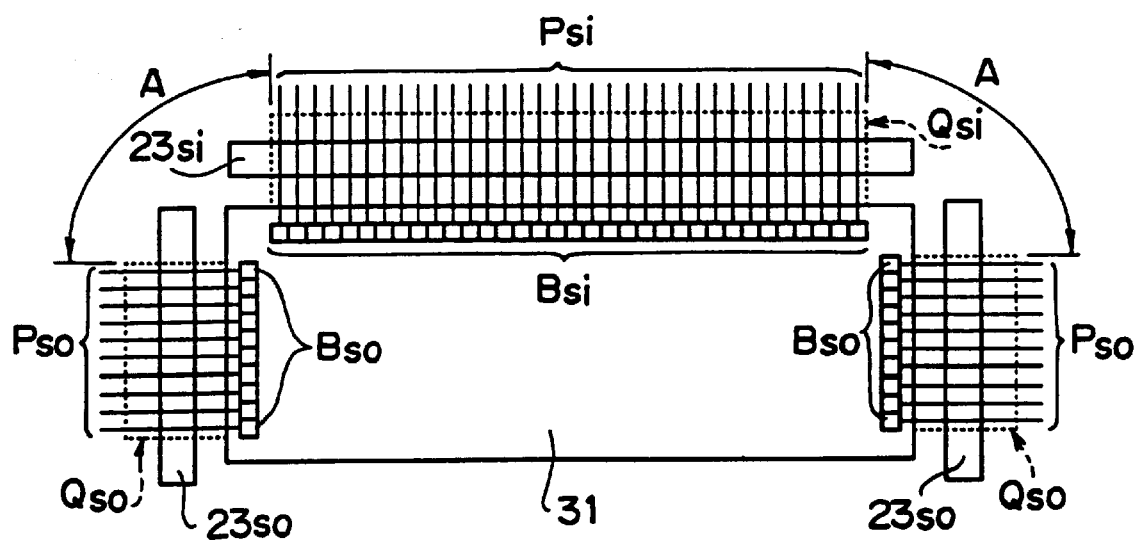
FIG. 5 is a plan view modeling the essential components of yet another embodiment of a drive IC pertaining to the present invention and yet another embodiment of a liquid crystal panel pertaining to the present invention.

FIG. 5 shows the essential components of yet another embodiment of a drive IC and a liquid crystal panel pertaining to the present invention. The point by which drive IC 31 of this embodiment differs from the previous drive IC 11 shown in FIG. 2 is that the signal electrode bumps Bsi are arrayed concentrated on one side of the drive IC 31, and the scan electrode bumps Bso are arrayed divided up on other sides of the drive IC 31. The signal electrode bumps Bsi may be arrayed on only one side of the drive IC 31, and the scan electrodes bumps Bso may be arrayed only on one other side. Also, as long as the signal electrode bumps Bsi and the scan electrode bumps Bso are arrayed so as not to mix with each other on any one side of the drive IC 31, the signal electrode bumps Bsi and the scan electrode bumps Bso may be arrayed on any side.

If constructed in the above manner, because a sufficiently large gap A between the signal electrode area Qsi and the scan electrode area Qso can be secured, the display properties can be tested by displaying a test image to the entirety of the display area of the liquid crystal panel. Also, because the placement error margin of the signal electrode area Qsi or the scan electrode area Qso in relation to the base external surface of the liquid crystal panel can be made still larger, the margin of the liquid crystal panel manufacturing process and the margin of placement error when testing the display properties of the liquid crystal panel unit can be further widened.

Sixth Embodiment

Figure 6:
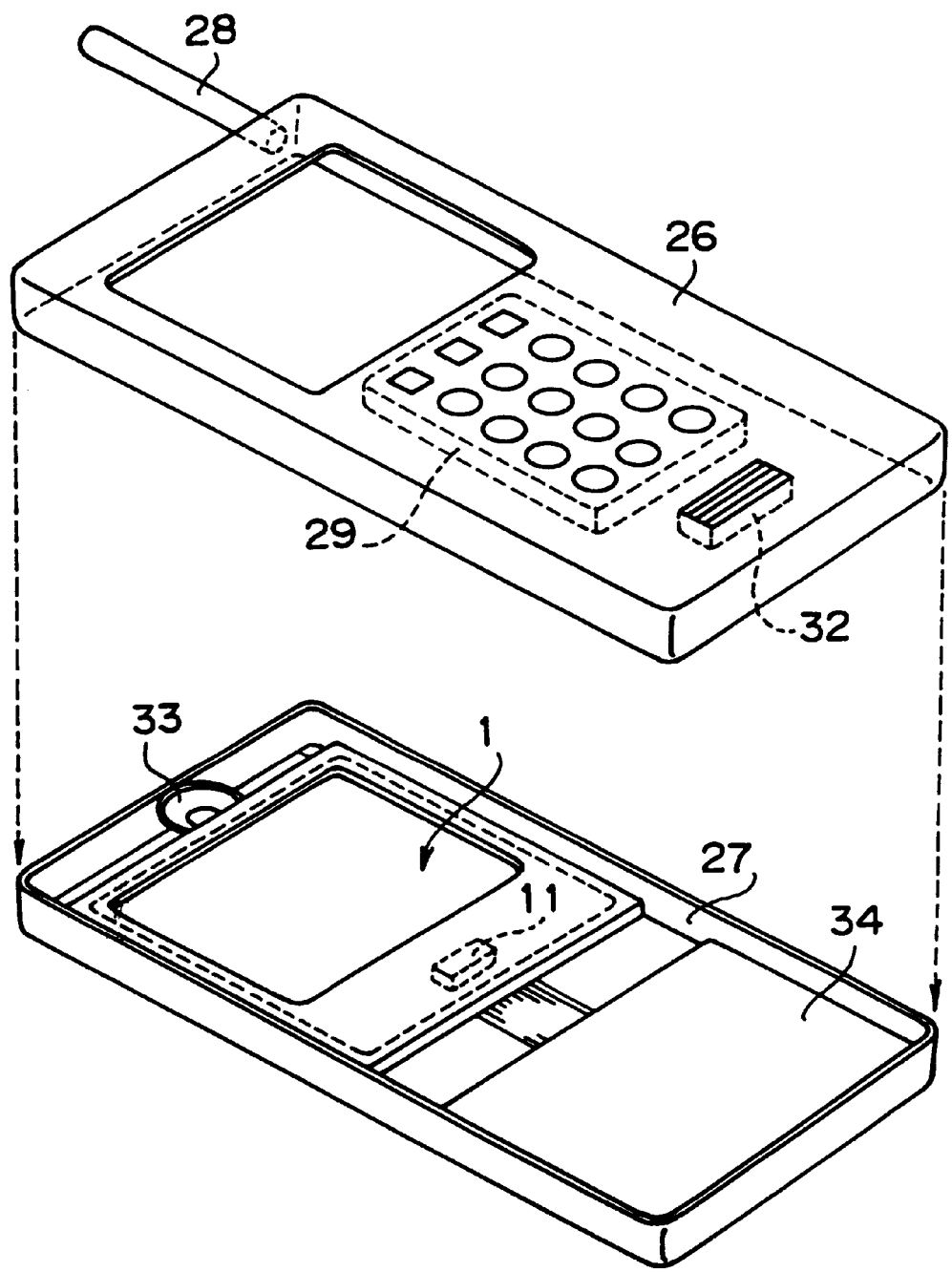
FIG. 6 is a perspective drawing of one embodiment of an electronic apparatus pertaining to the present invention.

FIG. 6 shows an embodiment using a liquid crystal device pertaining to the present invention as the display of a portable telephone as an example of an electronic apparatus. The portable telephone shown here is constructed including an upper case 26 and a lower case 27. On the upper case are provided a transceiver antenna 28, a keyboard unit 29, and a microphone 32. Also, on the lower case 27 are provided a liquid crystal device 1, for example as shown in FIG. 1, a speaker 33, and a circuit board 34.

Figure 7:
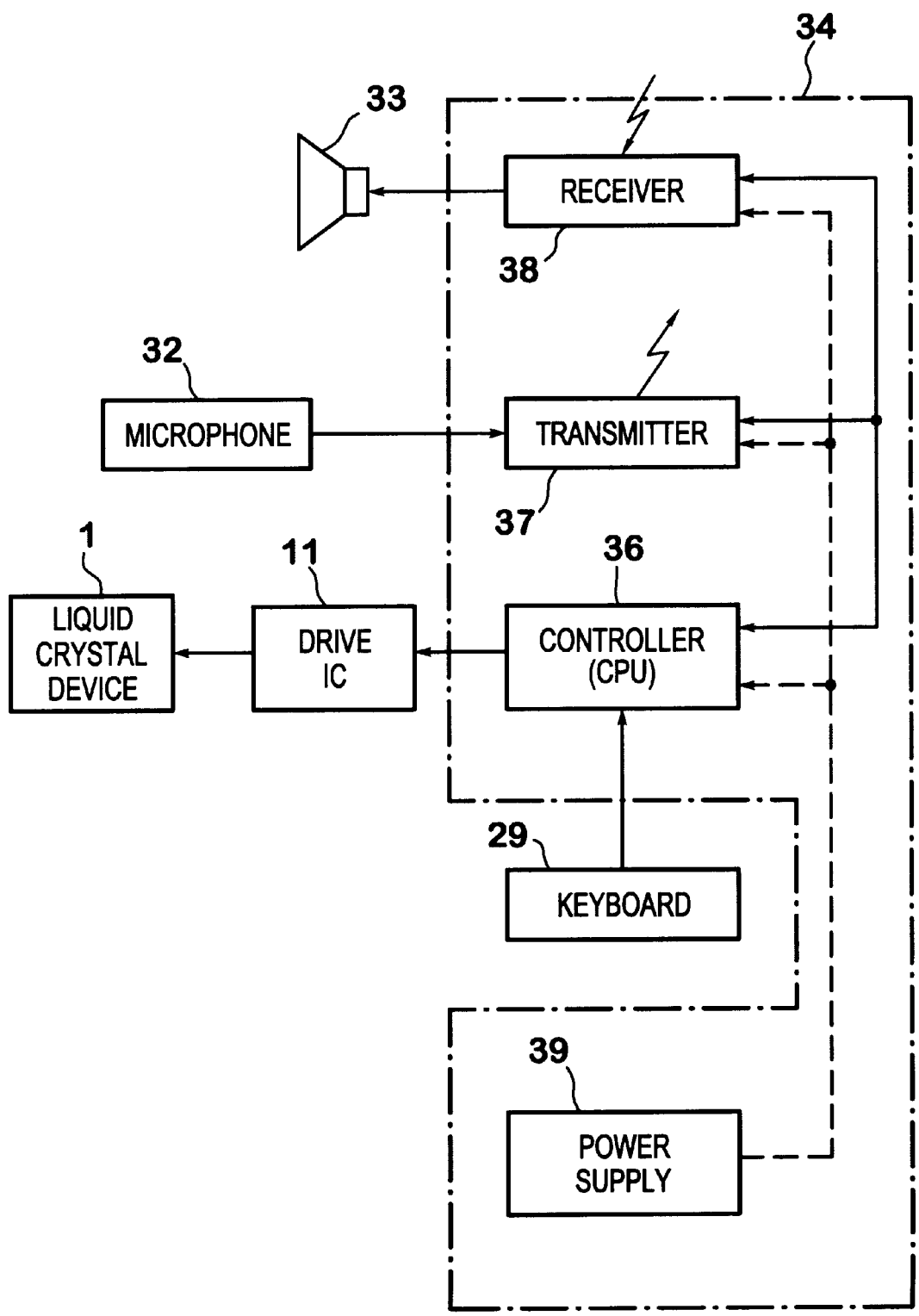
FIG. 7 is a circuit block drawing showing one example of a control system used in the electronic apparatus of FIG. 6.
Figure 8:
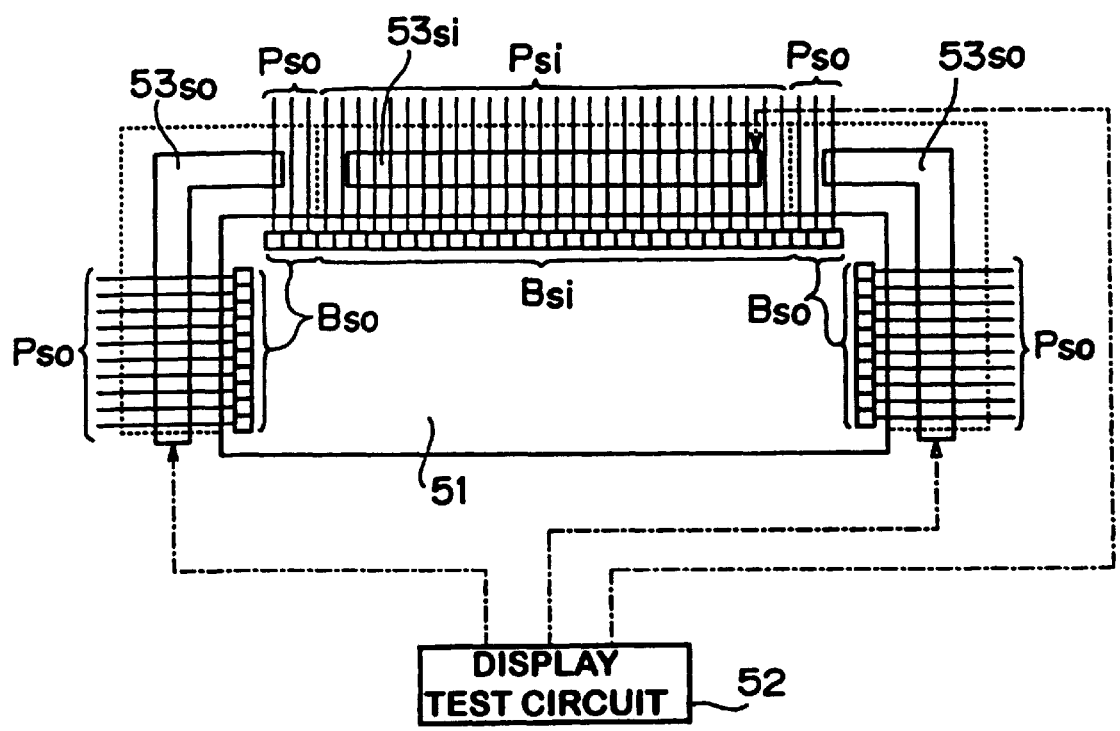
FIG. 8 is a plan view modeling the essential components of one example of a conventional drive IC and one example of a conventional liquid crystal panel.

As shown in FIG. 7, on the circuit board 34 are provided a receiver 38 connected to the input terminals of the speaker 33, a transmitter 37 connected to the output terminals of the microphone 32, a controller 36 constructed including a CPU, and a power supply 39 that provides electric power to each component. The controller 36 reads the states of the transmitter 37 and the receiver 38, supplies information to the drive IC 11 based on those results, and displays visual information to the display area of the liquid crystal device 1. Also, the controller 36 supplies information to the drive IC 11 based on information output from the keyboard unit 29, and displays visual information to the display area of the liquid crystal device 1.

Regarding the liquid crystal device 1 used in the portable telephone of the present embodiment, as shown in FIG. 2, a wide gap A is formed between the scan electrode bumps Bso and the signal electrode bumps Bsi of the drive IC 11, and furthermore, a similarly wide gap A is formed between the scan electrode area Qso and the signal electrode area Qsi of the liquid crystal panel.

What is claimed is:

1. A drive IC for driving a liquid crystal panel having a plurality of scan electrodes and a plurality of signal electrodes, comprising
   a set of scan electrode terminals formed on a face of said drive IC, said scan electrode terminals capable of being connected with respective ones of said scan electrodes, and
   a set of signal electrode terminals formed on said face, said electrode terminals capable of being connected with respective ones of said signal electrodes, wherein a gap formed between said set of scan electrode terminals and said set of signal electrode terminals is wider than a gap formed between adjacent ones of said scan electrode terminals and a gap formed between adjacent ones of said signal electrode terminals.

2. A drive IC for driving a liquid crystal panel having a plurality of scan electrodes and a plurality of signal electrodes, comprising:
   a set of scan electrode terminals formed on a face of said drive IC, said scan electrode terminals capable of being connected with respective ones of said scan electrodes; and
   a set of signal electrode terminals formed on said face, said electrode terminals capable of being connected with respective ones of said signal electrodes, wherein said set of scan electrode terminals and said set of signal electrode terminals are arranged respectively in an array on a same one side of the drive IC, and a gap formed between said set of scan electrode terminals and adjacent said set of signal electrode terminals is wider than a gap formed between adjacent ones of said scan electrode terminals and a gap formed between adjacent ones of said signal electrode terminals.

3. The drive IC as defined in claim 1, wherein the set of scan electrode terminals and the set of signal electrode terminals are provided respectively on separate sides of the drive IC.

4. The drive IC as defined in claim 1, wherein the gap between scan electrode terminals and adjacent signal electrode terminals is 0.3 mm or more.

5. The drive IC as defined in claim 2, wherein the gap between scan electrode terminals and adjacent signal electrode terminals is 0.3 mm or more.

6. The drive IC as defined in claim 3, wherein the gap between scan electrode terminals and adjacent signal electrode terminals is 0.3 mm or more.

7. The drive IC as defined in claim 1, wherein the gap between scan electrode terminals and adjacent signal electrode terminals is 0.6 mm or more.

8. The drive IC as defined in claim 2, wherein the gap between scan electrode terminals and adjacent signal electrode terminals is 0.6 mm or more.

9. The drive IC as defined in claim 3, wherein the gap between scan electrode terminals and adjacent signal electrode terminals is 0.6 mm or more.

10. The drive IC as defined in claim 1, wherein the gap between scan electrode terminals and adjacent signal electrode terminals is 1.0 mm or more.

11. The drive IC as defined in claim 2, wherein the gap between scan electrode terminals and adjacent signal electrode terminals is 1.0 mm or more.

12. The drive IC as defined in claim 3, wherein the gap between scan electrode terminals and adjacent signal electrode terminals is 1.0 mm or more.

13. A liquid crystal panel having a pair of mutually opposite translucent substrates holding liquid crystal between, comprising:
   a set of scan electrodes formed on one side of one translucent substrate adjacent to the liquid crystal,
   a set of signal electrodes formed on one side of the other translucent substrate adjacent to the liquid crystal, and
   an IC installation area for installing a drive IC, the IC installation area being formed on one of the translucent substrates, wherein said set of scan electrodes and said set of signal electrodes extend up to said IC installation area, and a gap formed between said set of scan electrodes and adjacent set of said signal electrodes in the IC installation area is wider than a gap formed between adjacent ones of said scan electrodes and a gap formed between adjacent ones of said signal electrodes.

14. A liquid crystal panel having a pair of mutually opposite translucent substrates holdings liquid crystal between, comprising:
   a set of scan electrodes formed on one side of one translucent substrate adjacent to the liquid crystal,
   a set of signal electrodes formed on one side of the other translucent substrate adjacent to the liquid crystal, and
   an IC installation area for installing a drive IC, the IC installation area being formed on one of the translucent substrates, wherein said set of scan electrodes and said set of signal electrodes extend up to said IC installation area, wherein said set of scan electrodes and said set of signal electrodes are arranged respectively in an array on a same one side of the IC installation area, and a gap formed between said set of scan electrodes and adjacent set of said signal electrodes is wider than a gap formed between adjacent ones of said scan electrodes and a gap formed between adjacent ones of said signal electrodes.

15. The liquid crystal panel as defined in claim 13, wherein the set of scan electrodes and the set of signal electrodes are provided respectively on separate sides of the IC installation area.

16. The liquid crystal panel as defined in claim 13, wherein the gap between scan electrodes and adjacent signal electrodes inside the IC installation area is 0.3 mm or more.

17. The liquid crystal panel as defined in claim 14, wherein the gap between scan electrodes and adjacent signal electrodes inside the IC installation area is 0.3 mm or more.

18. The liquid crystal panel as defined in claim 15, wherein the gap between scan electrodes and adjacent signal electrodes inside the IC installation area is 0.3 mm or more.

19. The liquid crystal panel as defined in claim 13, wherein the gap between scan electrodes and adjacent signal electrodes inside the IC installation area is 0.6 mm or more.

20. The liquid crystal panel as defined in claim 14, wherein the gap between scan electrodes and adjacent signal electrodes inside the IC installation area is 0.6 mm or more.

21. The liquid crystal panel as defined in claim 15, wherein the gap between scan electrodes and adjacent signal electrodes inside the IC installation area is 0.6 mm or more.

22. The liquid crystal panel as defined in claim 13, wherein the gap between scan electrodes and adjacent signal electrodes inside the IC installation area is 1.0 mm or more.

23. The liquid crystal panel as defined in claim 14, wherein the gap between scan electrodes and adjacent signal electrodes inside the IC installation area is 1.0 mm or more.

24. The liquid crystal panel as defined in claim 15, wherein the gap between scan electrodes and adjacent signal electrodes inside the IC installation area is 1.0 mm or more.

25. A liquid crystal device having a liquid crystal panel comprising a pair of mutually opposite translucent substrates holding liquid crystal between, and a drive IC mounted on at least one of the translucent substrates, wherein (A) said liquid crystal panel comprises
   a plurality of scan electrodes formed on one side of one translucent substrate adjacent the liquid crystal,
   a plurality of signal electrodes formed on one side of the other translucent substrates adjacent the liquid crystal, and
   an IC installation area for installing a drive IC, the IC installation area being formed on one of the translucent substrates, whereby said plurality of scan electrodes and said plurality of signal electrodes extend up to said IC installation area, (B) said drive IC comprises
   a plurality of scan electrode terminals for making electrical connections with said plurality of scan electrodes, and
   a plurality of signal electrode terminals for making electrical connections with said plurality of signal electrodes, whereby
   between mutually adjacent scan electrode terminals and signal electrode terminals is formed a gap wider than the gap among the scan electrode terminals and the gap among the signal electrode terminals and (C) the scan electrodes of the liquid crystal panel are conductively connected to the scan electrode terminals of the drive IC, and the signal electrodes of the liquid crystal are conductively connected to the signal electrode terminals of the drive IC.

26. An electronic apparatus comprising a liquid crystal device as defined in claim 25, a power supply that supplies electric power to the liquid crystal device, and a controller that controls the operation of the liquid crystal device.

* * * * *